(12) United States Patent
Oh et al.

(10) Patent No.: US 12,733,294 B2
(45) Date of Patent: Sep. 8, 2026

(54) MICRO SEMICONDUCTOR CHIP TRANSFER METHOD AND MICRO SEMICONDUCTOR CHIP TRANSFER DEVICE

(71) Applicant: SAMSUNG ELECTRONICS CO., LTD., Suwon-si (KR)

(72) Inventors: Youngtek Oh, Suwon-si (KR); Dongho Kim, Suwon-si (KR); Joonyong Park, Suwon-si (KR); Junsik Hwang, Suwon-si (KR); Dongkyun Kim, Suwon-si (KR); Sanghoon Song, Suwon-si (KR); Minchul Yu, Suwon-si (KR); Kyungwook Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 109 days.

(21) Appl. No.: 18/433,068

(22) Filed: Feb. 5, 2024

(65) Prior Publication Data

US 2024/0322068 A1 Sep. 26, 2024

(30) Foreign Application Priority Data

Mar. 24, 2023 (KR) ........................ 10-2023-0039010
Apr. 27, 2023 (KR) ........................ 10-2023-0055690

(51) Int. Cl.
*H10H 20/01* (2025.01)
*H10P 72/00* (2026.01)
*H10P 72/10* (2026.01)

(52) U.S. Cl.
CPC ......... *H10H 20/01* (2025.01); *H10P 72/0442* (2026.01); *H10P 72/16* (2026.01)

(58) Field of Classification Search
CPC .............. H10H 20/01; H01L 21/67132; H01L 21/67333; H01L 21/67144; H01L 25/0753
See application file for complete search history.

(56) References Cited

U.S. PATENT DOCUMENTS 6,281,038 B1 * 8/2001 Jacobsen ................. H01L 25/50 257/E21.705
6,527,964 B1 * 3/2003 Smith .................... B82Y 30/00 438/455
6,864,570 B2 * 3/2005 Smith ................... G02F 1/1362 257/E21.705
7,730,610 B2 6/2010 Nakagawa et al.
7,814,648 B2 10/2010 Nakagawa
7,867,563 B2 * 1/2011 Arase ..................... H05K 3/303 427/256
10,535,640 B2 1/2020 Lee et al.
2007/0082464 A1 * 4/2007 Schatz ................ H01L 21/6776 438/458

(Continued)

*Primary Examiner* — Christopher W Raimund
(74) *Attorney, Agent, or Firm* — Sughrue Mion, PLLC

(57) ABSTRACT

A micro semiconductor chip transfer method is provided and includes: preparing a transfer substrate including an upper portion having grooves formed therein; supplying, to the upper portion of the transfer substrate, a suspension including micro semiconductor chips and a liquid; and aligning the micro semiconductor chips in the grooves by sweeping, with an alignment bar that includes a hydrophobic wiper, an upper surface of the transfer substrate while the suspension is on the upper surface of the transfer substrate.

20 Claims, 16 Drawing Sheets

(56) References Cited

U.S. PATENT DOCUMENTS

| | | | |
|---|---|---|---|
| 2017/0133558 | A1 | 5/2017 | Sasaki et al. |
| 2018/0102352 | A1 | 4/2018 | Sasaki et al. |
| 2019/0326144 | A1 | 10/2019 | Shim et al. |
| 2022/0013400 | A1 | 1/2022 | Hwang et al. |

* cited by examiner

MICRO SEMICONDUCTOR CHIP TRANSFER METHOD AND MICRO SEMICONDUCTOR CHIP TRANSFER DEVICE

CROSS-REFERENCE TO RELATED APPLICATIONS

This application is based on and claims priority under 35 U.S.C. § 119 to Korean Patent Application Nos 10-2023-0039010, filed on Mar. 24, 2023, and Korean Patent Application No. 10-2023-0055690, filed on Apr. 27, 2023, in the Korean Intellectual Property Office, the disclosures of which are incorporated by reference herein in their entireties.

BACKGROUND

1. Field

The present disclosure relates to a micro semiconductor chip transfer method and a micro semiconductor chip transfer device.

2. Description of Related Art

The industrial demand for light-emitting diodes (LEDs) has increased due to their advantages of low power and eco-friendliness. LEDs are applied not only to lighting devices and liquid crystal display (LCD) backlights but also to display devices. In manufacturing display devices using micro-unit LED chips, a pick and place method is used to transfer micro LEDs. However, this method has low productivity as the size of micro LEDs is decreased and the size of displays is increased.

SUMMARY

Embodiments of the present disclosure, provide a micro semiconductor chip transfer method in a wet mode and a micro semiconductor chip transfer device.

Additional aspects will be set forth in part in the description which follows and, in part, will be apparent from the description, or may be learned by practice of the presented embodiments of the disclosure.

According to an aspect of an embodiment, a micro semiconductor chip transfer method includes: preparing a transfer substrate including an upper portion having grooves formed therein; supplying, to the upper portion of the transfer substrate, a suspension including micro semiconductor chips and a liquid; and aligning the micro semiconductor chips in the grooves by sweeping, with an alignment bar that includes a hydrophobic wiper, an upper surface of the transfer substrate while the suspension is on the upper surface of the transfer substrate.

The hydrophobic wiper may include a material insoluble in a polar solvent.

The hydrophobic wiper may include polytetrafluoroethylene or nylon.

The hydrophobic wiper may include a membrane filter, a general filter, a mesh, a sheet, or a thin film.

The hydrophobic wiper may include an opening, and a size of the opening of the hydrophobic wiper may be 100 μm or less.

The liquid may include at least one from among water, ethanol, alcohol, polyol, ketone, halocarbon, acetone, flux, and an organic solvent.

The suspension may further include a surfactant.

The supplying the suspension may include supplying the suspension using a spraying method, a dispensing method, an inkjet dot method, or a method of spilling the suspension onto the transfer substrate.

The sweeping with the alignment bar of the upper surface of the transfer substrate may include reciprocating, translating, rotating, rolling, rubbing, or spinning of the hydrophobic wiper.

The sweeping with the alignment bar of the upper surface of the transfer substrate may include performing a reciprocating motion, a rotational motion, a translational motion, a rolling motion, a rubbing, or a spinning of the transfer substrate.

The aligning may include aligning, by the sweeping, the micro semiconductor chips in a same direction in the grooves.

Each of the micro semiconductor chips may include a first surface including an electrode and a second surface without any electrode, and the aligning may include aligning, by the sweeping, the micro semiconductor chips in the grooves such that the second surface of each of the micro semiconductor chips faces a bottom of one of the grooves.

The micro semiconductor chip transfer method may further include cleaning the transfer substrate by removing, from the transfer substrate, the micro semiconductor chips that are not aligned inside the grooves and at least a portion of the liquid by sweeping the transfer substrate with an absorbent including a hydrophilic material.

The cleaning of the transfer substrate may include moving the absorbent in a reciprocating motion, a translational motion, a rotational motion, a rolling motion, a rubbing motion, or a spinning motion.

According to an aspect of an embodiment, a micro semiconductor chip transfer device includes: a transfer substrate including an upper portion having grooves formed therein; a transfer head on which the transfer substrate is seated; a suspension supply module configured to supply a suspension to the upper portion of the transfer substrate on the transfer head, the suspension including at least one micro semiconductor chip and a liquid; and an align bar that includes a hydrophobic wiper that is configured to sweep the transfer substrate.

The hydrophobic wiper may include a material insoluble in a polar solvent.

The hydrophobic wiper may include polytetrafluoroethylene or nylon.

The hydrophobic wiper may include a membrane filter, a general filter, a mesh, a sheet, or a thin film.

The suspension may include a surfactant.

The micro semiconductor chip may further include a cleaning module including an absorbent including a hydrophilic material that is configured for cleaning the transfer substrate by removing, from the transfer substrate, at least a portion of the liquid and one or more of the at least one micro semiconductor chip that is not aligned inside the grooves.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
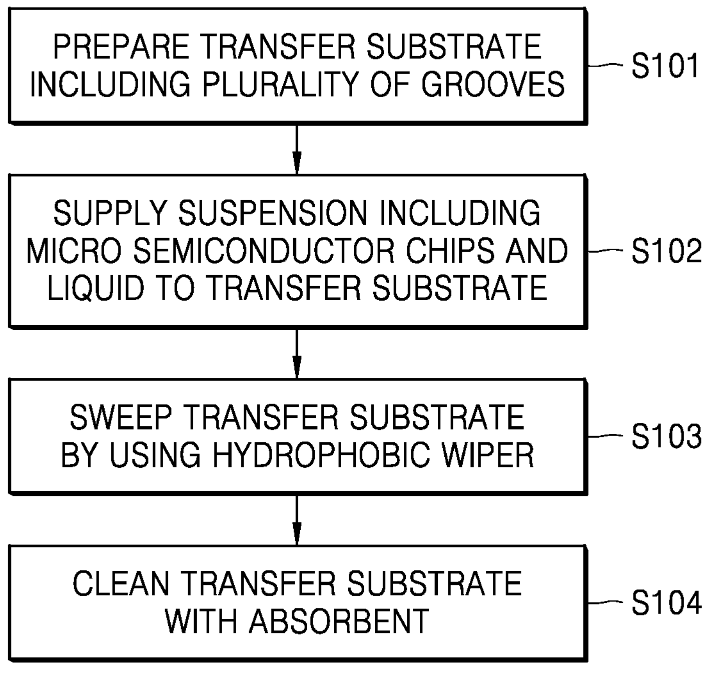
FIG. 1 is a flowchart illustrating a micro semiconductor chip transfer method according to an embodiment.

Reference will now be made in detail to embodiments of the present disclosure, examples of which are illustrated in the accompanying drawings, wherein like reference numerals refer to like elements throughout. In this regard, the embodiments of the present disclosure may have different forms and should not be construed as being limited to the descriptions set forth herein. Accordingly, the embodiments are described below, by referring to the figures, to explain non-limiting example aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a method of transferring a micro semiconductor chip and a device for transferring a micro semiconductor chip according to various embodiments will be described in detail with reference to the accompanying drawings. In the following drawings, the same reference numerals refer to the same components, and the size of each component in the drawings may be exaggerated for clarity and convenience of description. In addition, embodiments described below are merely illustrative, and various modifications are possible from these embodiments.

Hereinafter, the term "upper portion" and "on" may also include "to be present above on a non-contact basis" as well as "to be on the top portion in direct contact with". The singular expression includes plural expressions unless the context clearly implies otherwise. In addition, when a part "includes" a component, this means that it may further include other components, not excluding other components unless otherwise expressed.

The use of the term "the" and similar indicative terms may correspond to both singularity and plurality. Unless there is clear order or contrary description of the steps constituting methods of embodiments of the present disclosure, these steps may be performed in the appropriate order, and are not necessarily limited to the order described.

The connection or connection members of lines between the components shown in the drawings represent example functional connection and/or physical or circuit connections, and may be replaceable or represented as various additional functional connections, physical connections, or circuit connections in an actual device.

Further, the terms "unit", "module" and the like mean a unit that processes functions or operations, which may be implemented in hardware or software or implemented in a combination of hardware and software.

The use of all examples and illustrative terms is simply to describe technical ideas in detail, and the scope of the present disclosure is not limited to these examples and illustrative terms.

FIG. 1 is a flowchart illustrating a micro semiconductor chip transfer method according to an embodiment.

The micro semiconductor chip transfer method may include preparing a transfer substrate including a plurality of grooves in an upper portion thereof (operation S101), supplying, to an upper portion of the transfer substrate, a suspension including a plurality of micro semiconductor chips and a liquid (operation S102), and sweeping an upper surface of the transfer substrate including the suspension by using an align bar including a hydrophobic wiper, to align the micro semiconductor chips in the grooves (operation S103). The micro semiconductor chip transfer method may further include cleaning the micro semiconductor chips not aligned inside the grooves and the remaining liquid by sweeping the transfer substrate with an absorbent of a hydrophilic material (operation S104).

A transfer substrate including a plurality of grooves in an upper portion thereof is prepared (operation S101). The transfer substrate may be provided as a single layer or a plurality of layers.

A suspension including a plurality of micro semiconductor chips is supplied to an upper portion of the transfer substrate (operation S102). The suspension may include the micro semiconductor chips and a liquid.

The micro semiconductor chips are aligned inside the grooves by sweeping the upper surface of the transfer substrate including the suspension using an align bar including hydrophobic wipers (operation S103). The align bar including a hydrophobic wiper may be used to move the micro semiconductor chips to a plurality of grooves in the transfer substrate.

The transfer substrate is swept with an absorbent of a hydrophilic material to remove the remaining liquid and micro semiconductor chips that are not aligned inside the grooves (operation S104). The absorbent may remove micro semiconductor chips and liquids from the transfer substrate.

Figure 2A:
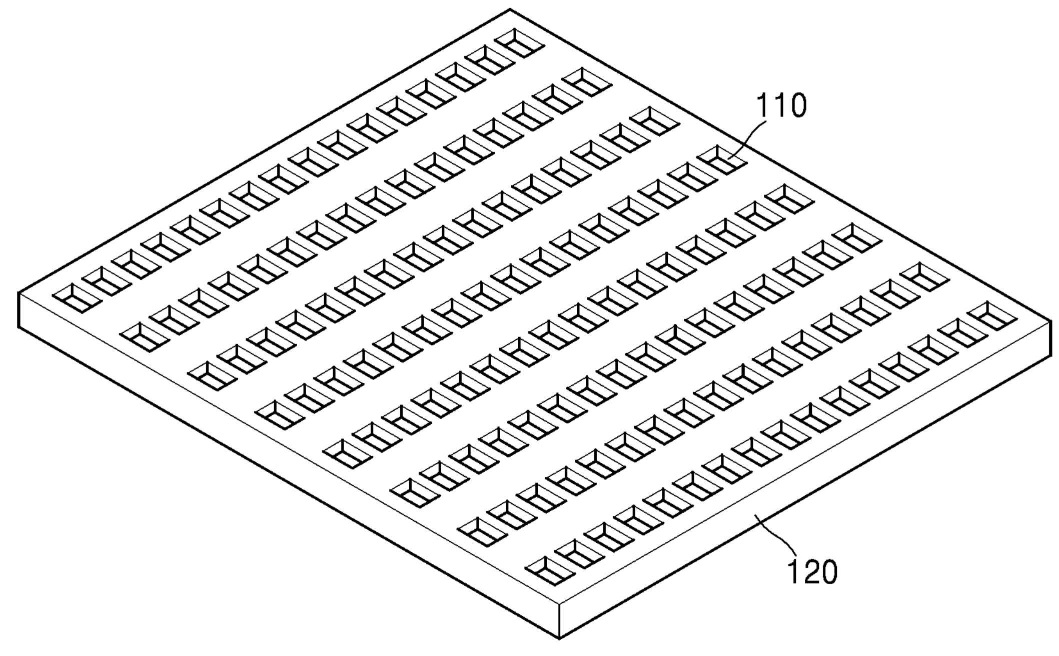
FIG. 2A is a diagram illustrating a perspective view of a transfer substrate used in a micro semiconductor chip transfer method according to an embodiment.
Figure 2B:
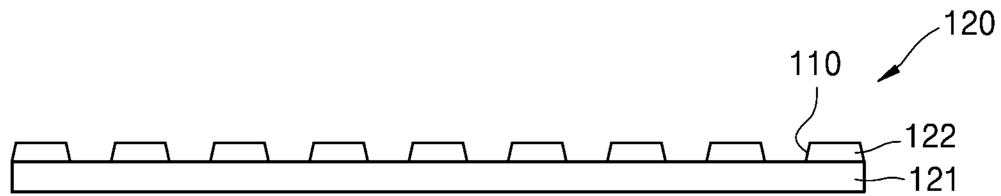
FIG. 2B is a diagram illustrating a cross-sectional view of the transfer substrate used in the micro semiconductor chip transfer method according to the embodiment.
Figure 2C:
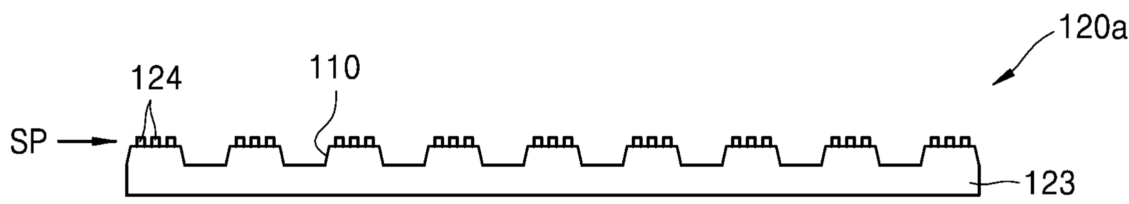
FIG. 2C is a diagram illustrating a cross-sectional view of another example transfer substrate used in the micro semiconductor chip transfer method according to the embodiment.

FIGS. 2A to 2C are diagrams illustrating a transfer substrate used in a micro semiconductor chip transfer method according to an embodiment. For example, FIG. 2A is a diagram illustrating a perspective view of a transfer substrate according to embodiment, FIG. 2B is a diagram illustrating a cross-sectional view of the transfer substrate, and FIG. 2C is a diagram illustrating a cross-sectional view of another example transfer substrate, according to an embodiment.

Referring to FIG. 2A, a transfer substrate 120 including a plurality of grooves 110 may be provided at an upper portion thereof. The grooves 110 may be provided to arrange a plurality of a micro semiconductor chip 131 of FIG. 3. The plurality of the micro semiconductor chip 131 may include various types of semiconductor chips having a micro-size, and the micro-size may be about 100 μm or less. Each of the grooves 110 may have a cross-sectional area larger than an area of each micro semiconductor chip 131 to accommodate the micro semiconductor chip 131.

The micro semiconductor chip 131 may include, for example, a light emitting diode (LED), a Field Effect Transistor (FET), a Complementary Metal-Oxide Semiconductor (CMOS), a CMOS Image Sensor (CIS), a Vertical-Cavity Surface-Emitting Laser (VCSEL), a Photo Diode (PD), a memory element, a 2 dimensional (2D) material device, or the like. The 2D material may be graphene or carbon nanotube (CNT).

Referring to FIG. 2B, the gaps between the plurality of grooves 110 may correspond to the gaps between a plurality of the micro semiconductor chip 131 inserted into the grooves 110. For example, when the micro semiconductor chip 131 is one LED, a gap between a plurality of grooves 110 may correspond to a gap between pixels of a display device used in a final product. However, the gaps between the plurality of grooves 110 are not limited thereto, and may be variously modified.

The transfer substrate 120 may include a plurality of layers. For example, the transfer substrate 120 may include a base substrate 121 and a guide mold 122. The base substrate 121 and the guide mold 122 may include same or different materials. The transfer substrate 120 may be also formed of a single layer. In addition, the planar shape of the transfer substrate 120 may be rectangular, but is not limited thereto, and may be, for example, circular in a planar shape.

The grooves 110 and the upper surface of the transfer substrate 120 may have different adhesion or different surface energy densities. The upper surface of the transfer substrate 120 may have an uneven pattern that weakens adhesion to the micro semiconductor chip 131, or a rough surface, making it difficult for the micro semiconductor chip 131 to adhere thereto. The lower surface of the grooves 110, that is, the base substrate 121, may be surface-treated with a material that strengthens the adhesion to the micro semiconductor chip 131. For example, the grooves 110 may be surface-treated with a hydrophilic material, and the upper surface of the transfer substrate 120 may be surface-treated with a hydrophobic material. Alternatively, the adhesion or surface energy density may vary by physically patterning the upper surface of the transfer substrate 120.

Referring to FIG. 2C, the transfer substrate 120*a* may include a body 123 having the plurality of grooves 110, and a surface energy reduction pattern SP consisting of a plurality of convex patterns 124 formed in an area between the plurality of grooves 110 on the upper surface of the body 123.

The surface energy reduction pattern SP, which includes the plurality of convex patterns 124 formed on the transfer substrate 120*a*, may lower the surface energy of the upper surface of the body 123 connected to the grooves 110, preventing the micro semiconductor chip 131 from being fixed to the upper surface of the body 123. In other words, the surface energy reduction pattern SP improves the sliding of the micro semiconductor chip 131 on the upper surface of the body 123 so that the micro semiconductor chip 131 may move well inside one of the grooves 110 without being pressed to a position other than its regular position. In general, the surface energy between the interfaces where the two surfaces are in contact is proportional to the contact area. When the convex patterns 124 are provided, the surface energy of the interface between the bottom surface of the micro semiconductor chip 131 and the transfer substrate 120*a* may be lowered, so that the micro semiconductor chip 131 moves well inside one of the grooves 110. Furthermore, since the adhesion or surface energy density between the convex patterns 124 and the micro semiconductor chip 131 is low, the micro semiconductor chip 131 may be easily separated from the convex patterns 124 when a magnetic field is applied.

The widths of the convex patterns 124 and the gap between the convex patterns 124 may be set so that the micro semiconductor chip 131 is not fixed on the convex patterns 124, and the path of the micro semiconductor chip 131 moving toward the grooves 110 is not disturbed by the convex patterns 124. Although the cross-sectional shape of each of the convex patterns 124 is illustrated as a circular shape, this is only an example. The cross-sectional shape of each of the convex patterns 124 may be changed to various polygonal shapes, annular shapes, oval shapes, or other shapes.

The widths of the convex patterns 124 may be less than the widths of the plurality of the micro semiconductor chip 131. To lower the surface energy at the interface between the convex patterns 124 and the micro semiconductor chip 131. For example, the width of each of the convex patterns 124 may be set to about 50% or less, about 30% or less, or about 10% or less of the width of the micro semiconductor chip 131.

Figure 3:
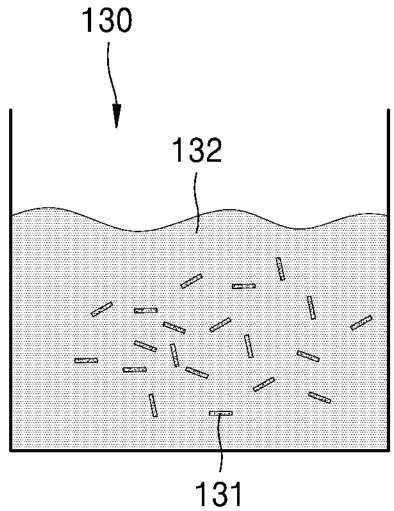
FIG. 3 is a diagram illustrating a suspension used in a micro semiconductor chip transfer method according to an embodiment.

FIG. 3 is a diagram illustrating a suspension used in a micro semiconductor chip transfer method according to an embodiment.

Referring to FIG. 3, the suspension 130 may include a plurality of the micro semiconductor chip 131 and a liquid 132. The liquid 132 may be used as long as it does not corrode or damage the plurality of the micro semiconductor chip 131. For example, the liquid may include one selected from a group including water, ethanol, alcohol, polyol, ketone, halocarbon, acetone, flux, and an organic solvent, or a plurality of combinations thereof. The organic solvent may contain, for example, isopropyl alcohol (IPA). The available liquid is not limited thereto, and various modifications are possible.

The supplying of the suspension 130 may be implemented by using various ways, such as a spray method, a dispensing method that drops the liquid, an inkjet dot method that discharges the liquid like a printing method, or a method of flowing the suspension 130 to the transfer substrate 120.

The supplying of the suspension 130 including the plurality of the micro semiconductor chip 131 to the transfer substrate 120 may be performed in two operations: an operation of supplying the liquid 132 to the grooves 110 of the transfer substrate 120 and another operation of supplying the plurality of the micro semiconductor chip 131 to the transfer substrate 120. The method of supplying liquid 132 to the grooves 110 may be implemented by using various ways, such as spraying, dispensing, inkjet dot, flowing liquid 132 to the transfer substrate 120, or the like. The supply amount of the liquid 132 may be variously adjusted to fit the grooves 110 or to overflow from the grooves 110.

The suspension 130 including the plurality of the micro semiconductor chip 131 and the liquid 132 may further include a surfactant. When the surfactant is supplied together with the suspension 130, the transfer yield of the micro semiconductor chip 131 may be improved compared to the case where the surfactant is not supplied.

Figure 4A:
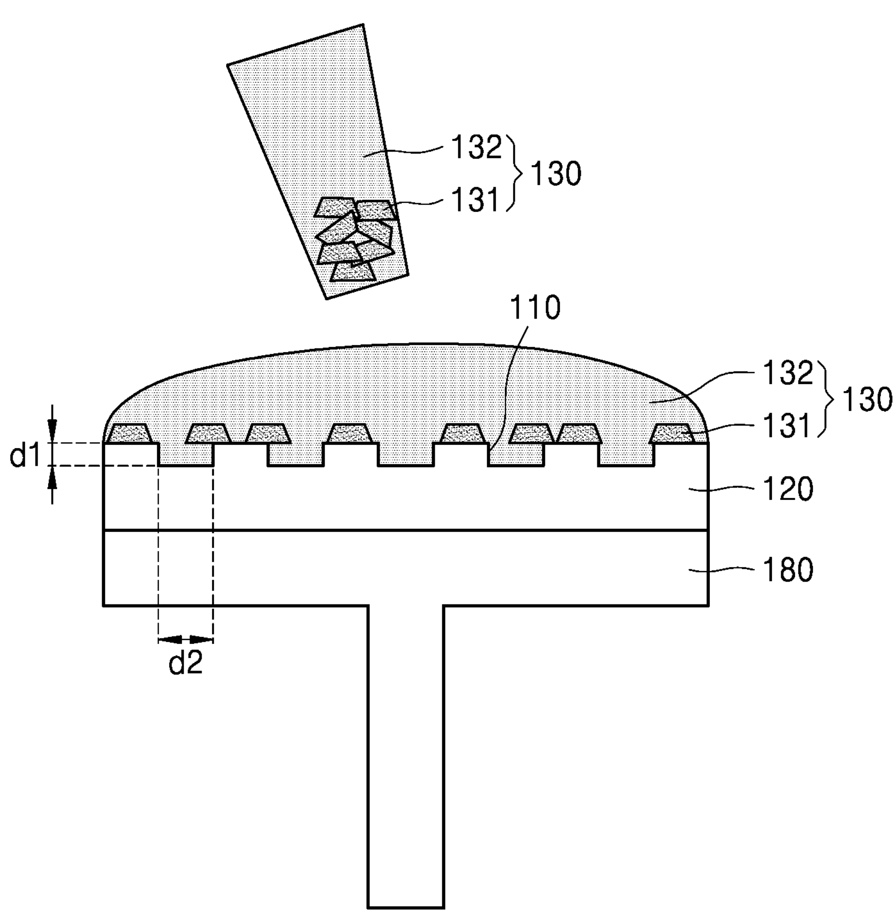
FIGS. 4A, 4B, and 4C are diagrams illustrating a micro semiconductor chip transfer method according to an embodiment.
Figure 4B:
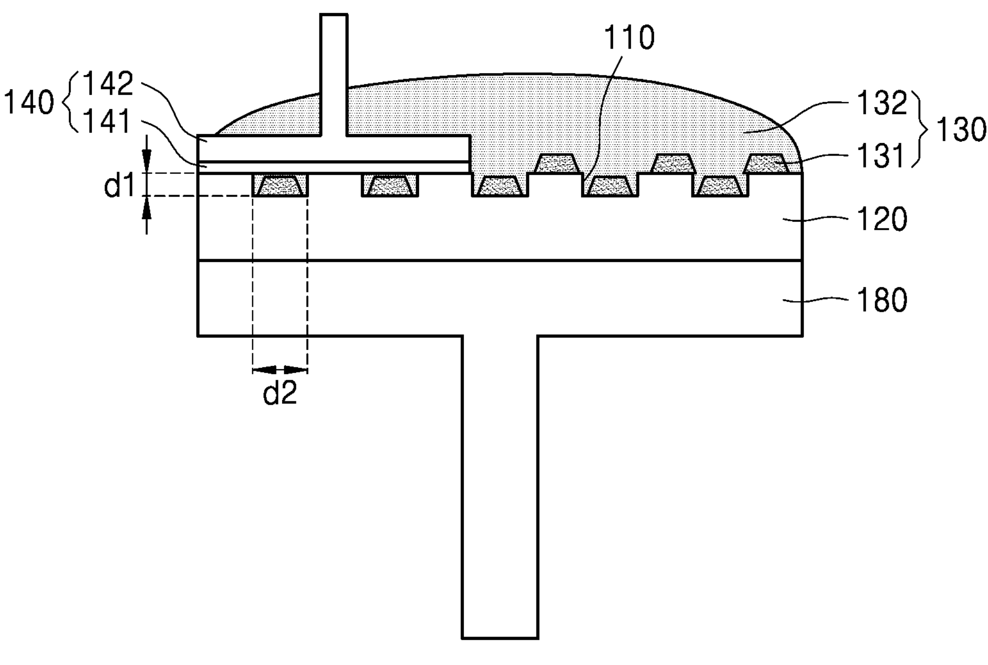
Figure 4C:
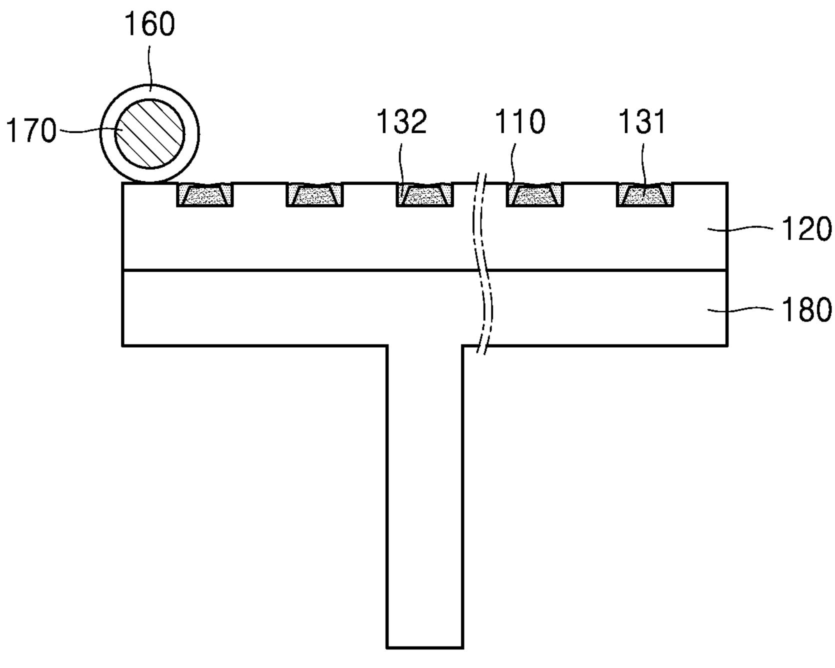

FIGS. 4A, 4B, to 4C are diagrams illustrating a micro semiconductor chip transfer method according to an embodiment.

Referring to FIG. 4A, a transfer substrate 120 including a plurality of grooves 110 may be prepared on a transfer head 180. A depth d1 of each of the grooves 110 may be about 20% less than a height of each micro semiconductor chip 131. A width d2 of each of the grooves 110 may be about 25% greater than a width of each micro semiconductor chip 131. Thereafter, a suspension 130 including the plurality of the micro semiconductor chip 131 and a liquid 132 may be supplied to the transfer substrate 120.

Referring to FIG. 4B, an align bar 140 including a hydrophobic wiper 141 may be used to sweep the upper surface of the transfer substrate 120. By sweeping the upper surface of the transfer substrate 120 using the align bar 140 including the hydrophobic wiper 141, the plurality of the micro semiconductor chip 131 may be aligned in a same direction in the grooves 110. For example, the plurality of the micro semiconductor chip 131 include a first surface including an electrode and a second surface without an electrode. By sweeping the upper surface of the transfer substrate 120 by using the align bar 140 including the hydrophobic wiper 141, the plurality of the micro semiconductor chip 131 to be aligned in the grooves 110 may be aligned to face the bottom of the grooves 110.

The hydrophobic wiper 141 may be made of a material that is not dissolvable in a polar solvent. The hydrophobic wiper 141 may include fluorine. The hydrophobic wiper 141 may include a fluoropolymer-based material. The hydrophobic wiper 141 may include polytetrafluoroethylene (PTFE). The hydrophobic wiper 141 may include a polyamide-based material. The hydrophobic wiper 141 may include nylon.

The hydrophobic wiper 141 may include, for example, a membrane filter, a general filter, a mesh, a sheet, or a thin film. When the hydrophobic wiper 141 has a mesh shape, the hydrophobic wiper 141 has a plurality of openings, and the size of each of the openings may be less than or equal to the size of the micro semiconductor chip 131 to prevent the micro semiconductor chip 131 from being stuck or caught by the openings. The size of the opening of the hydrophobic wiper 141 may be, for example, about 100 μm or less. The hydrophobic wiper 141 may be used alone without other auxiliary devices, but is not limited thereto, and may be combined with a first support 142 to facilitate transfer of the micro semiconductor chip 131. The hydrophobic wiper 141 may transfer the micro semiconductor chip 131 while being provided on the surface of the first support 142. The first support 142 may have various shapes and structures suitable for transferring the micro semiconductor chip 131. The first support 142 may have the form of a rod, blade, plate, or wiper. The hydrophobic wiper 141 may be provided on any one surface of the first support 142 or may surround the circumference of the first support 142.

The sweeping of the upper surface of the transfer substrate 120 using the align bar 140 including the hydrophobic wiper 141 may be performed using a variety of methods, such as a reciprocating method, a translating method, a rotating method, a sliding method, a rolling method, a rubbing method, and/or a spinning method, and may include both regular and irregular methods. Instead of moving the hydrophobic wiper 141, the transfer of the micro semiconductor chip 131 may be performed by moving the transfer substrate 120, and a transfer head 180 may be used for this purpose. The movement of the transfer substrate 120 to move the transfer head 180 on which the transfer substrate 120 is seated may also be performed by sliding, rotating, translating, reciprocating, rolling, spinning, rubbing, or the like. According to embodiments, it is also possible to transfer the micro semiconductor chip 131 by cooperation between the hydrophobic wiper 141 and the transfer head 180.

When using a hydrophobic wiper 141, the transfer process of the micro semiconductor chip 131 and the cleaning process of the transfer substrate 120 may be separated from each other, unlike when using a hydrophilic wiper, and the transfer yield may be improved compared to when using the hydrophilic wiper. In addition, when the hydrophobic wiper 141 is used during the transfer process of the micro semiconductor chip 131, the hydrophobic wiper 141 does not absorb the liquid 132 and the micro semiconductor chip 131, and the liquid 132 does not dry, so there is no need to supply additional liquid 132. The hydrophobic wiper 141 may be made of a soft material, which can reduce friction between the micro semiconductor chip 131 and the hydrophobic wiper 141. Accordingly, damage to the micro semiconductor chip 131 may be prevented.

Referring to FIG. 4C, the transfer substrate 120 may be swept with an absorbent 160 of a hydrophilic material to remove, from the transfer substrate 120, the plurality of the micro semiconductor chip 131, which are not aligned inside the grooves 110 and the remaining liquid 132. The absorbent 160 is sufficient as long as it is made of a material capable of absorbing the liquid 132, and its shape or structure is not limited. The absorbent 160 may include, for example, fabrics, tissues, polyester fibers, paper, wipers, etc. The absorbent 160 may be used alone without any other auxiliary devices, but is not limited thereto, and may be combined with a second support 170 to facilitate cleaning of the transfer substrate 120. The second support 170 may have various shapes and structures suitable for cleaning the transfer substrate 120. The second support 170 may have the form of a rod, blade, plate, or wiper, for example. The absorbent 160 may be provided on any one surface of the second support 170, or may surround the circumference of the second support 170.

The absorbent 160 may clean the transfer substrate 120 while pressing the transfer substrate 120 at an appropriate pressure. Cleaning may include an operation in which the absorbent 160 contacts the transfer substrate 120 and absorbs the liquid 132 while passing through the plurality of grooves 110.

After the absorbent 160 sweeps the transfer substrate 120, the micro semiconductor chips remaining on the transfer substrate 120 without being aligned inside the grooves 110 and the remaining liquid may be removed. The cleaning of the transfer substrate 120 with the absorbent 160 may be implemented by various ways such as, for example, the sliding method, the reciprocating method, the translating method, the rotating method, the rolling method, the rubbing method, and/or spinning method of the absorbent 160, and may include both regular and irregular methods. Cleaning may be performed by moving the transfer substrate 120 instead of moving the absorbent 160, and cleaning may be performed by cooperation between the absorbent 160 and the transfer substrate 120.

Figure 5A:
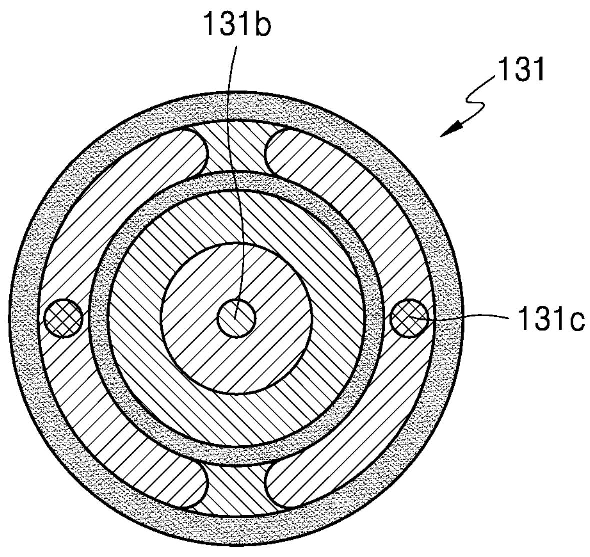
FIGS. 5A and 5B are diagrams schematically illustrating a structure of a micro semiconductor chip according to an embodiment.
Figure 5B:
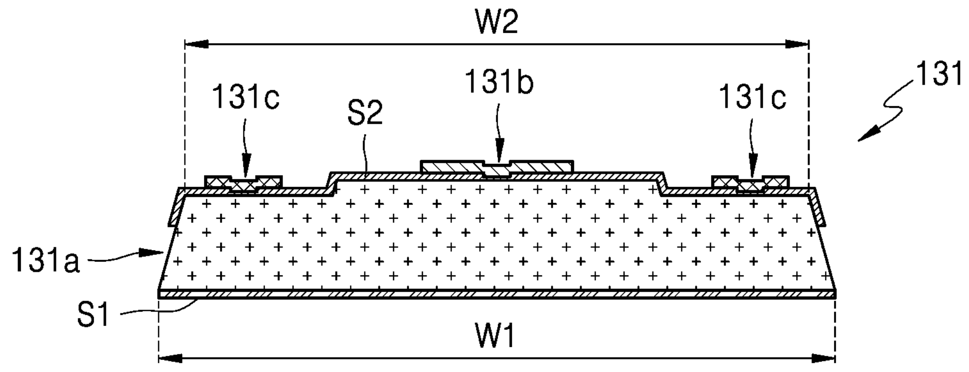

FIGS. 5A and 5B are diagrams schematically illustrating a structure of a micro semiconductor chip according to an embodiment. For example, FIG. 5A is a diagram schematically illustrating a top view of the structure of the micro semiconductor chip, and FIG. 5B is a diagram schematically illustrating a cross-sectional view of the structure of the micro semiconductor chip.

Referring to FIG. 5A, the micro semiconductor chip 131 may include a first electrode 131*b* and second electrodes 131*c*. The micro semiconductor chip 131 may be circular when viewed from the top. However, the embodiments are not limited thereto, and the micro semiconductor chip 131 may have various shapes such as a rectangle.

Referring to FIG. 5B, the micro semiconductor chip 131 may include a chip body 131*a*, the first electrode 131*b*, and the second electrodes 131*c*. The micro semiconductor chip 131 may be configured to be easily aligned in one direction using a fluidic self-assembly method. When aligning a plurality of the micro semiconductor chip 131 on external objects such as substrates using a fluid self-assembly method, most or all of the plurality of the micro semiconductor chip 131 may be aligned in a same direction. For example, the plurality of the micro semiconductor chip 131 may be aligned so that a first surface S1, which is a lower surface of each micro semiconductor chip 131, contacts an external object, and a second surface S2, which is an upper surface of each micro semiconductor chip 131, does not contact the external object.

To this end, the micro semiconductor chip 131 may be configured so that the van der Waals force between the first surface S1 of the micro semiconductor chip 131 and the external contact surface is greater than the van der Waals force between the second surface S2 of the micro semiconductor chip 131 and the external contact surface. In this case, when the first surface S1 of the micro semiconductor chip 131 comes into contact with the external contact surface, it is relatively difficult to be separated from each other. When the second surface S2 of the micro semiconductor chip 131 comes into contact with the external contact surface, it is relatively easy to be separated from each other. Therefore, when aligning the micro semiconductor chip 131, the probability that the micro semiconductor chip 131 is arranged so that the first surface S1 of the micro semiconductor chip 131 contacts the external contact surface may increase.

The van der Waals force may be greater as two objects come closer to each other or as the area of contact between the two objects increases. Accordingly, according to an embodiment, the surface roughness of the first surface S1 of the micro semiconductor chip 131 may be less than the surface roughness of the second surface S2 of the micro semiconductor chip 131. As a result, a relatively very smooth surface is formed on the first surface S1, which is the lower part of the micro semiconductor chip 131, and a relatively uneven surface may be formed on the second surface S2, which is the upper part of the micro semiconductor chip 131.

In addition, the area of the first surface S1 of the micro semiconductor chip 131 may be greater than the area of the second surface S2 of the micro semiconductor chip 131. To this end, the width W1 of the first surface S1 of the micro semiconductor chip 131 may be greater than the width W2 of the second surface S2 of the micro semiconductor chip 131. For example, the width W2 of the second surface S2 may be about 0.7 times or more and less than about 1 times, or about 0.8 times or more and about 0.95 times or less the width W1 of the first surface S1. Accordingly, the side surface of the micro semiconductor chip 131 may have an inclined shape.

Figure 6:
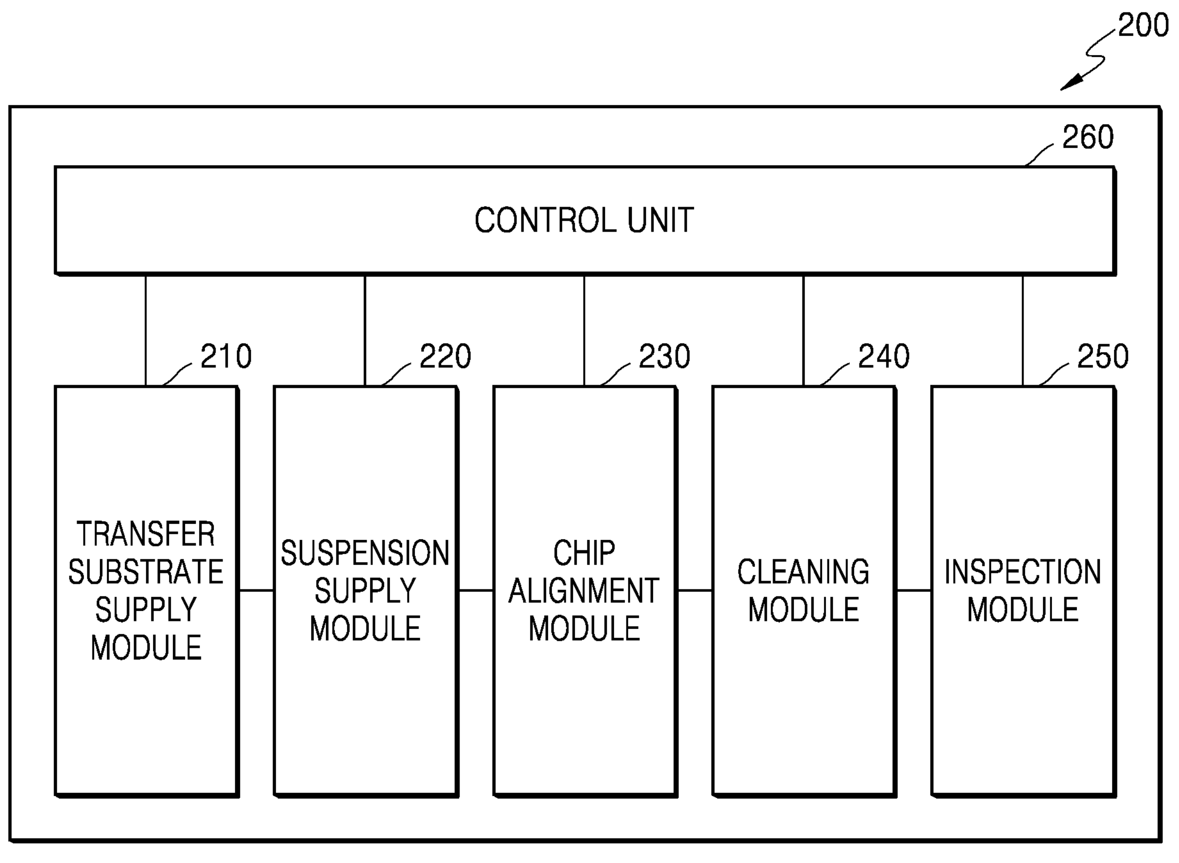
FIG. 6 is a diagram illustrating a micro semiconductor chip transfer device according to an embodiment.

FIG. 6 is a diagram illustrating a micro semiconductor chip transfer device according to an embodiment.

The micro semiconductor chip transfer device 200 may include a transfer head 180 of FIG. 4A, on which a transfer substrate 120 having a plurality of multiple grooves 110 formed thereon is seated, a suspension supply module 220 of FIG. 6 for supplying a suspension 130 including a micro semiconductor chip 131 and a liquid 132 above the transfer substrate 120 on the transfer head 180 of FIG. 4A, and an align bar 140 of FIG. 4B including a hydrophobic wiper 141 for sweeping the transfer substrate 120.

The micro semiconductor chip transfer device 200 may include a transfer substrate supply module 210, a suspension supply module 220, and a chip alignment module 230. The transfer substrate supply module 210 may supply a transfer substrate 120 for transferring the micro semiconductor chip 131 and a transfer head 180 on which the transfer substrate 120 is settled.

The suspension supply module 220 includes a suspension 130 including a plurality of the micro semiconductor chips 131 and the liquid 132, and may supply the suspension 130 to the transfer substrate 120. The suspension 130 may further include a surfactant. Alternatively, a liquid supply module for supplying the liquid 132 on the transfer substrate 120 and a chip supply module for supplying a plurality of the micro semiconductor chip 131 may be separately provided. In this case, the liquid supply module may include a liquid sprayer, a liquid spreader, a liquid dispenser, an inkjet dot device, a liquid diffuser, or the like, and the chip supply module may supply micro semiconductor chips in various ways, such as spraying or dispersing the semiconductor chips on the transfer substrate 120.

The chip alignment module 230 may sweep the transfer substrate 120 using the align bar 140 including the hydrophobic wiper 141. The hydrophobic wiper 141 may be the same as described with reference to FIG. 4B.

The micro semiconductor chip transfer device 200 may further include a cleaning module 240, an inspection module 250, and a control unit 260.

The cleaning module 240 may be configured to clean the transfer substrate 120 by removing each micro semiconductor chip 131 remaining on the surface of the transfer substrate 120 (also referred to as a "dummy micro semiconductor chip") without being aligned inside the grooves 110 and the liquid 132 after the plurality of the micro semiconductor chip 131 have been aligned in the plurality of grooves 110 by the chip alignment module 230. The cleaning module 240 may remove the dummy micro semiconductor chip by various methods. The cleaning module 240 may include the absorbent 160 made of a hydrophilic material for removing a micro semiconductor chip 131 that is not aligned inside the groove 110 and the liquid 132, by cleaning the transfer substrate 120. Cleaning using the absorbent 160 may be the same as described with reference to FIG. 4C.

The inspection module 250 may inspect the state of the transfer substrate 120. The inspection module 250 may be a camera capable of analyzing a high-resolution image. The inspection module 250 may inspect the state of the transfer substrate 120 through image analysis.

For example, the inspection module 250 may inspect the alignment state of the micro semiconductor chip 131 on the transfer substrate 120. Based on the inspection results by the inspection module 250, the control unit 260 may control at least one of the suspension supply module 220 and the chip alignment module 230 to operate. Accordingly, alignment accuracy of the plurality of the micro semiconductor chip 131 may be improved.

For example, as a result of the inspection by the inspection module 250, the location of at least one of the grooves 110 in which the micro semiconductor chip 131 is missing may be confirmed from among the grooves 110 of the transfer substrate 120. In this case, based on the inspection results by the inspection module 250, the control unit 260 may control at least one of the suspension supply module 220 and the chip alignment module 230 to operate around the location of the groove 110 where the micro semiconductor chip 131 is missing.

For example, the inspection module 250 may inspect the supply status of the plurality of the micro semiconductor chip 131 and the liquid 132 on the transfer substrate 120. For example, the inspection module 250 may examine whether the liquid 132 exists on the transfer substrate 120 or whether the liquid is sufficient even if the liquid 132 exists. For example, the inspection module 250 can examine whether a micro semiconductor chip 131 exists on the transfer substrate 120 or whether if the micro semiconductor chips are sufficient even if the plurality of the micro semiconductor chip 131 exist. Based on the inspection result by the inspection module 250, the control unit 260 may control the suspension supply module 220 to operate.

In this way, the control unit 260 may improve the alignment accuracy of the plurality of the micro semiconductor chip 131 by controlling the suspension supply module 220 to operate based on the inspection results of the inspection module 250.

According to embodiments, the control unit 260 (e.g., a controller) may include at least one processor and memory storing computer instructions. The computer instructions may be configured to, when executed by the at least one processer, cause the control unit 260 to perform its functions.

Figure 7:
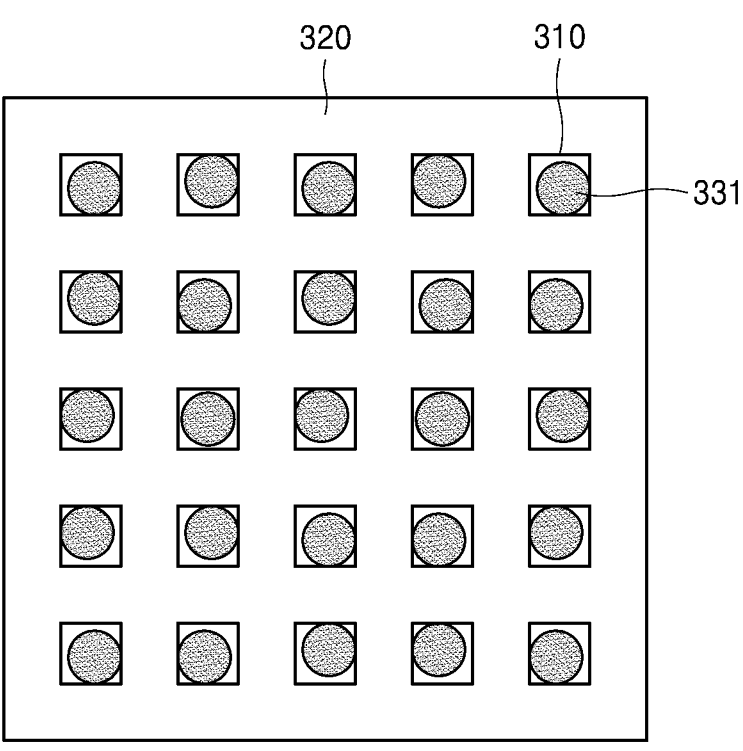
FIG. 7 illustrates an example of a state in which micro semiconductor chips are aligned on a transfer substrate.

FIG. 7 illustrates an example of a state in which micro semiconductor chips are aligned on a transfer substrate.

The plurality of the micro semiconductor chip 331 that is transferred may be irregularly and randomly arranged in the grooves 310 of the transfer substrate 320 according to the transfer method of the micro semiconductor chips described above. While micro semiconductor chips aligned according to a stamping method of a comparative embodiment may be regularly placed in the grooves of the transfer substrate, the plurality of the micro semiconductor chip 331 aligned according to the embodiments of the present disclosure may be irregularly placed in the grooves 310 of the transfer substrate 320. Meanwhile, after the transfer of the plurality of the micro semiconductor chip 331 is completed and the dummy micro semiconductor chips not arranged in the grooves 310 are removed, the irregularity of the irregularly arranged micro semiconductor chips may be reduced by sweeping the transfer substrate 320 more than once with a clean absorbent.

Figure 8A:
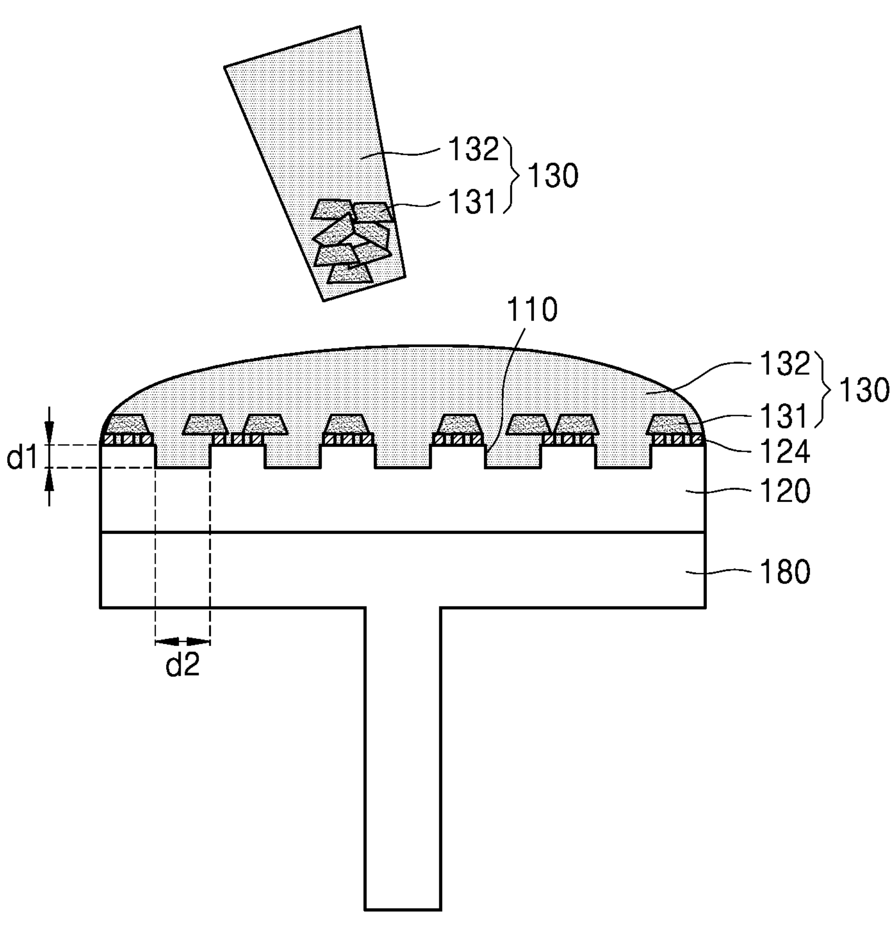
FIGS. 8A, 8B, and 8C are diagrams illustrating a micro semiconductor chip transfer method according to another embodiment.
Figure 8B:
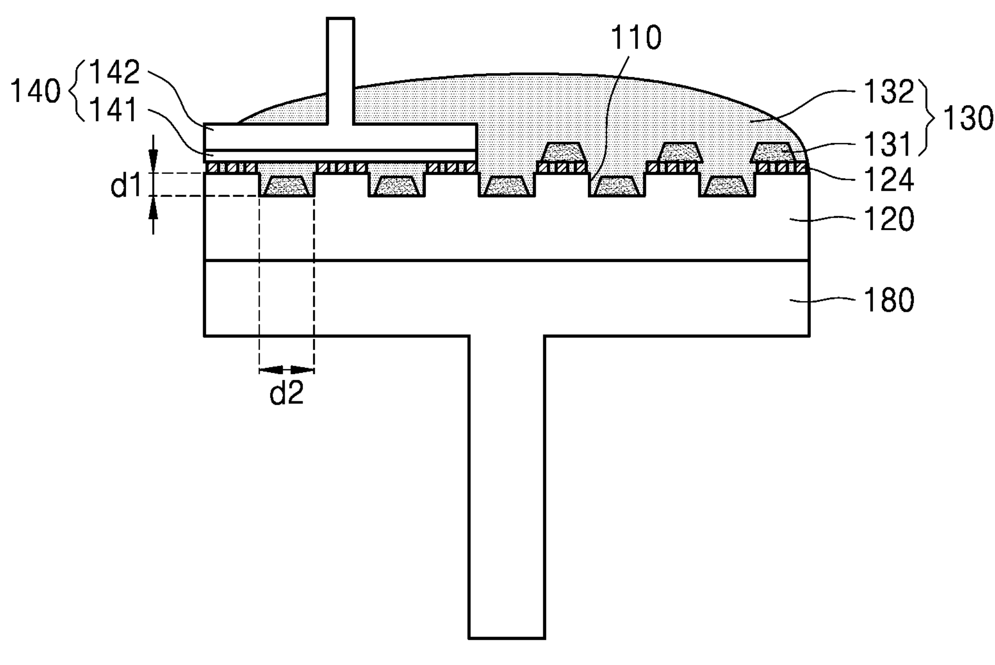
Figure 8C:
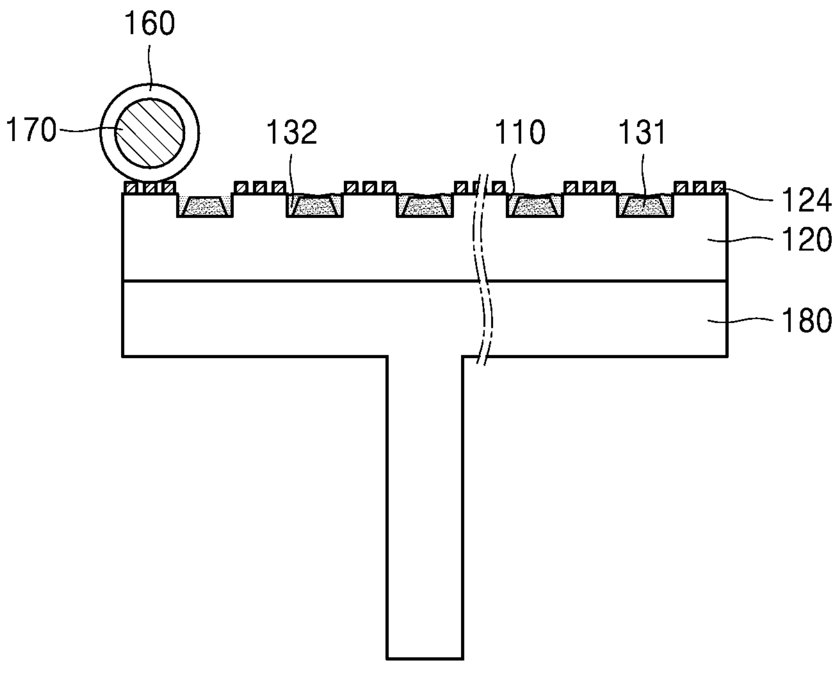

FIGS. 8A, 8B, and 8C are diagrams illustrating a micro semiconductor chip transfer method according to another embodiment.

Referring to FIG. 8A, a transfer substrate 120 including a plurality of grooves 110 may be prepared on a transfer head 180. A surface energy reduction pattern consisting of a number of convex patterns 124 formed in areas between the plurality of grooves 110 may be included on the upper surface of the transfer substrate 120. The convex patterns 124 may be the same as the convex patterns 124 of FIG. 2C.

Referring to FIG. 8B, an align bar 140 including a hydrophobic wiper 141 may be used to sweep the upper surface of the transfer substrate 120.

Referring to FIG. 8C, the transfer substrate 120 may be swept with an absorbent 160 of a hydrophilic material to remove the plurality of the micro semiconductor chip 131, which are not aligned inside the grooves 110 and the remaining liquid 132, from the transfer substrate 120 by cleaning the transfer substrate 120.

The transfer method of the micro semiconductor chips according to the embodiment of FIGS. 8A to 8C may be the same as the transfer method of the micro semiconductor chips described with reference to FIGS. 4A to 4C, except that the transfer substrate 120 includes the convex patterns 124.

Figure 9:
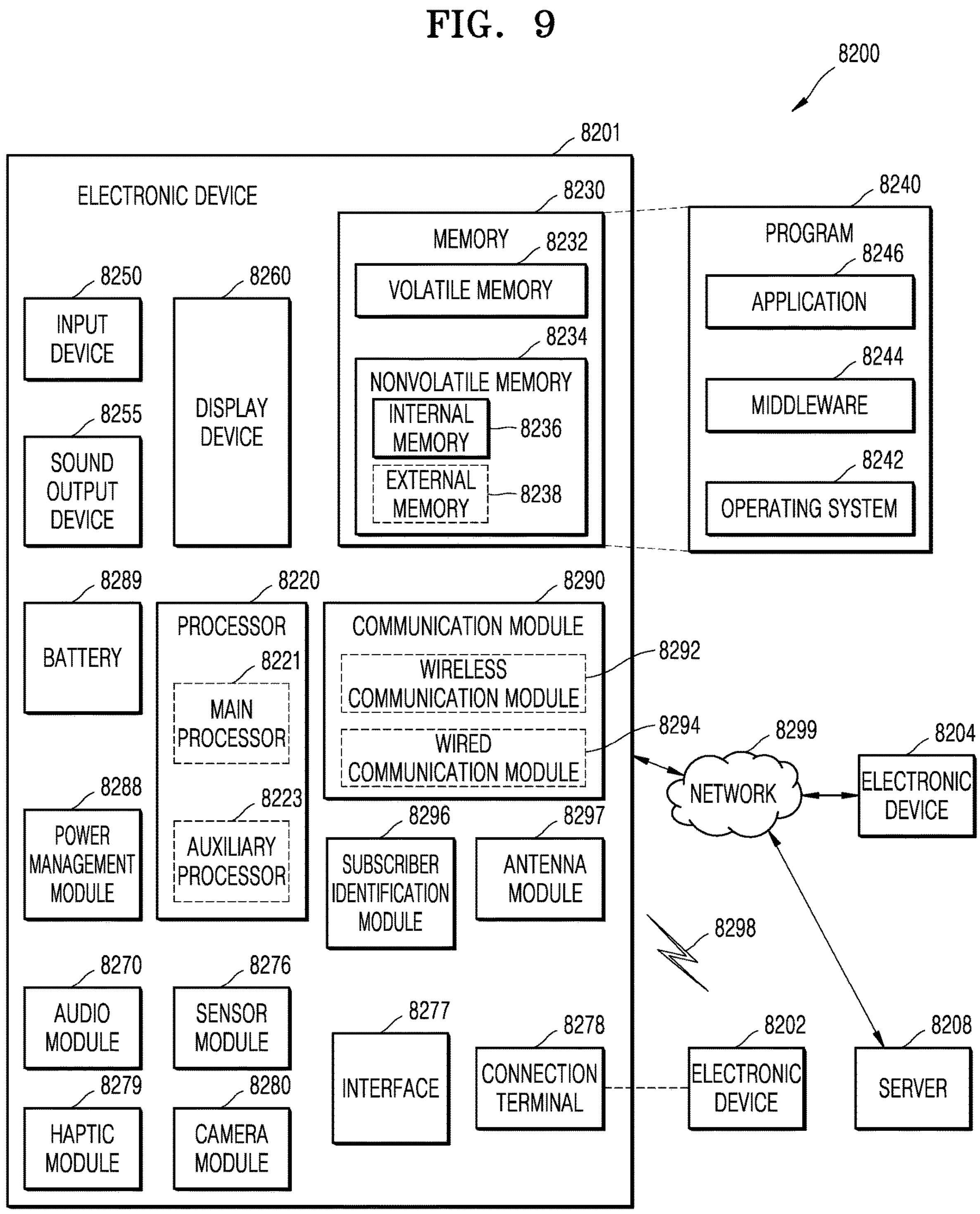
FIG. 9 is a block diagram of an electronic device including a display transfer structure according to an embodiment.

FIG. 9 is a block diagram of an electronic device including a display transfer structure according to an embodiment.

Referring to FIG. 9, an electronic device 8201 may be provided in a network environment 8200. In the network environment 8200, the electronic device 8201 may communicate with another electronic device 8202 through a first network 8298 (e.g., a short-range wireless communication network, etc.) or communicate with another electronic device 8204 and/or a server 8208 through a second network 8299 (e.g., a long-range wireless communication network, etc.). The electronic device 8201 may communicate with the electronic device 8204 through the server 8208. The electronic device 8201 may include a processor 8220, a memory 8230, an input device 8250, a sound output device 8255, a display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of these components may be omitted from or other components may be added to the electronic device 8201. Some of these components may be implemented as one integrated circuit. For example, the sensor module 8276 (e.g., fingerprint sensor, iris sensor, illumination sensor, etc.) may be implemented by being embedded in the display device 8260 (e.g., display, etc.).

The processor 8220 may execute software (e.g., program 8240 or the like) to control one or a plurality of other components (e.g., hardware and software components, or the like) of the electronic device 8201 connected to the processor 8220, and may perform processing or operations of various data. As part of data processing or operation, the processor 8220 may load commands and/or data received from other components (e.g., sensor modules 8276, communication modules 8290, etc.), process commands and/or data stored in volatile memory 8232, and store the result data in nonvolatile memory 8234. The processor 8220 may include a main processor 8221 (e.g., a central processing unit, an application processor, etc.) and an auxiliary processor 8223 (e.g., a graphics processing unit, an image signal processor, a sensor hub processor, a communication processor, etc.) that may be operated independently of or together with the main processor 8221. The auxiliary processor 8223 may use less power than the main processor 8221 and perform a specialized function.

The auxiliary processor 8223 may control functions and/or states related to some (e.g., the display device 8260, sensor module 8210, communication module 8290, etc.) of the components of the electronic device 8201, in place of the main processor 8221 while the main processor 8221 is in an inactive state (slip state), or together with the main processor 8221 while the main processor 8221 is in an active state (application execution state). The auxiliary processor 8223 (e.g., image signal processor, communication processor, etc.) may be implemented as part of other functionally related components (e.g., camera module 8280, communication module 8290, etc.).

The memory 8230 may store various data used by components (e.g., processor 8220 and sensor module 8276) of the electronic device 8201. The data may include, for example, input data and/or output data for software (e.g., program 8240 or the like) and related commands. The memory 8230 may include a volatile memory 8232 and/or a nonvolatile memory 8234.

The program 8240 may be stored in the memory 8230 as software, and may include an operating system 8242, middleware 8244, and/or an application 8246.

The input device 8250 may receive commands and/or data to be used in components (e.g., processor 8220, etc.) of the electronic device 8201 from the outside (e.g., user, etc.) of the electronic device 8201. The input device 8250 may include a microphone, a mouse, a keyboard, and/or a digital pen (e.g., a stylus pen, etc.).

The sound output device 8255 may output the sound signal to the outside of the electronic device 8201. The sound output device 8255 may include a speaker and/or a receiver. Speakers may be used for general purposes such as multimedia playback or recording playback, and receivers may be used to receive incoming calls. The receiver may be coupled as part of a speaker or may be implemented as an independent separate device.

The display device 8260 may visually provide information to the outside of the electronic device 8201. The display device 8260 may include a display, a hologram device, or a projector and a control circuit for controlling the corresponding devices. The display device 8260 may be manufactured by the manufacturing method described with reference to FIGS. 1 to 4C and 8A to 8C. The display device 8260 may include a touch circuitry configured to sense a touch, and/or a sensor circuit (a pressure sensor, etc.) configured to measure an intensity of a force generated by the touch.

The audio module 8270 may convert sound into an electrical signal or conversely convert the electrical signal into sound. The audio module 8270 may acquire sound through the input device 8250 or output sound through the sound output device 8255 and/or a speaker and/or a headphone of another electronic apparatus (e.g., electronic device 8202, etc.) directly or wirelessly connected to the electronic device 8201.

The sensor module 8276 may detect an operating state (e.g., power, temperature, etc.) or an external environmental state (e.g., user state, etc.) of the electronic device 8201 and generate an electrical signal and/or a data value corresponding to the sensed state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 8277 may support one or more designated protocols that may be used for electronic device 8201 to be directly or wirelessly connected to another electronic apparatus (e.g., electronic device 8202, etc.). The interface 8277 may include a high definition multimedia interface (HDMI), a universal serial bus (USB) interface, an SD card interface, and/or an audio interface.

The connection terminal 8278 may include a connector through which the electronic device 8201 may be physically connected to another electronic apparatus (e.g., electronic device 8202, etc.). The connection terminal 8278 may include an HDMI connector, a USB connector, an SD card connector, and/or an audio connector (e.g., a headphone connector, etc.).

The haptic module 8279 may convert an electrical signal to a mechanical stimulus (e.g., vibration, motion, etc.) or an electrical stimulus that a user can recognize through a tactile or motion sensation. The haptic module 8279 may include a motor, a piezoelectric element, and/or an electrical stimulus.

The camera module 8280 may capture a still image and a moving image. The camera module 8280 may include a lens assembly including one or more lenses, image sensors, image signal processors, and/or flashes. The lens assembly included in the camera module 8280 may concentrate light emitted from an object to be photographed.

The power management module 8288 may manage power supplied to the electronic device 8201. The power management module 8288 may be implemented as part of a power management integrated circuit (PMIC).

The battery 8289 may supply power to components of the electronic device 8201. The battery 8289 may include a non-rechargeable primary battery, a rechargeable secondary battery, and/or a fuel cell.

The communication module 8290 may establish a direct (wired) communication channel and/or wireless communication channel between the electronic device 8201 and another electronic apparatus (e.g., the electronic device 8202, the electronic device 8204, the server 8208, etc.), and support communication execution through the established communication channel. The communication module 8290 may include one or more communication processors that operate independently of the processor 8220 (e.g., application processor, etc.) and support direct communication and/or wireless communication. The communication module 8290 may include a wireless communication module 8292 (e.g., a cellular communication module, a short-range wireless communication module, a Global Navigation Satellite System (GNSS), etc.) communication module, and/or a wired communication module 8294 (e.g., a local area network (LAN) communication module, a power line communication module, etc.). A corresponding communication module of these communication modules may communicate with other electronic apparatuses through a first network 8298 (e.g., a short-range communication network such as Bluetooth, WiFi Direct, or infrared data association (IrDA)), or a second network 8299 (e.g., a long-range communication network such as a cellular network, Internet, or computer network (e.g., LAN, WAN, etc.)). These various types of communication modules may be integrated into a single component (e.g., a single chip, etc.), or may be implemented as a plurality of separate components (e.g., multiple chips). The wireless communication module 8292 may identify and authenticate the electronic device 8201 in a communication network such as a first network 8298 and/or a second network 8299 using subscriber information (e.g., an international mobile subscriber identifier (IMSI) stored in the subscriber identification module 8296).

The antenna module 8297 may transmit a signal and/or power to the outside (e.g., another electronic apparatus, etc.) or receive the signal and/or power from the outside. The antenna may include a radiator formed of a conductive pattern formed on the substrate (e.g., PCB, etc.). The antenna module 8297 may include one or a plurality of antennas. When a plurality of antennas are included, an antenna suitable for a communication scheme used in a communication network such as a first network 8298 and/or a second network 8299 may be selected from among the plurality of antennas by the communication module 8290. A signal and/or power may be transmitted or received between the communication module 8290 and another electronic apparatus through the selected antenna. Other components (e.g., RFIC, etc.) in addition to the antenna may be included as a part of the antenna module 8297.

Some of the components are connected to each other and may exchange signals (e.g., commands, data, etc.) via a communication scheme (bus, General Purpose Input and Output (GPIO), Serial Peripheral Interface (SPI), Mobile Industry Processor Interface (MIPI), etc.) and can interchange signals (e.g., commands, data, etc.) between peripherals.

The command or data may be transmitted or received between the electronic device 8201 and the external electronic device 8204 through the server 8208 connected to the second network 8299. Other electronic apparatuses (e.g., the electronic device 8202 and the electronic device 8204) may be the same or different types of apparatuses as the electronic device 8201. All or some of the operations executed in the electronic device 8201 may be executed in one or more of the other electronic apparatuses (e.g., the electronic device 8202, the electronic device 8204, and server 8208). For example, when the electronic device 8201 needs to perform a function or service, it may request one or more other electronic apparatuses to perform part or all of the function or service instead of executing the function or service on its own. One or more other electronic apparatuses receiving the request may execute an additional function or service related to the request and transmit a result of the execution to the electronic device 8201. To this end, cloud computing, distributed computing, and/or client-server computing technology may be used.

Figure 10:
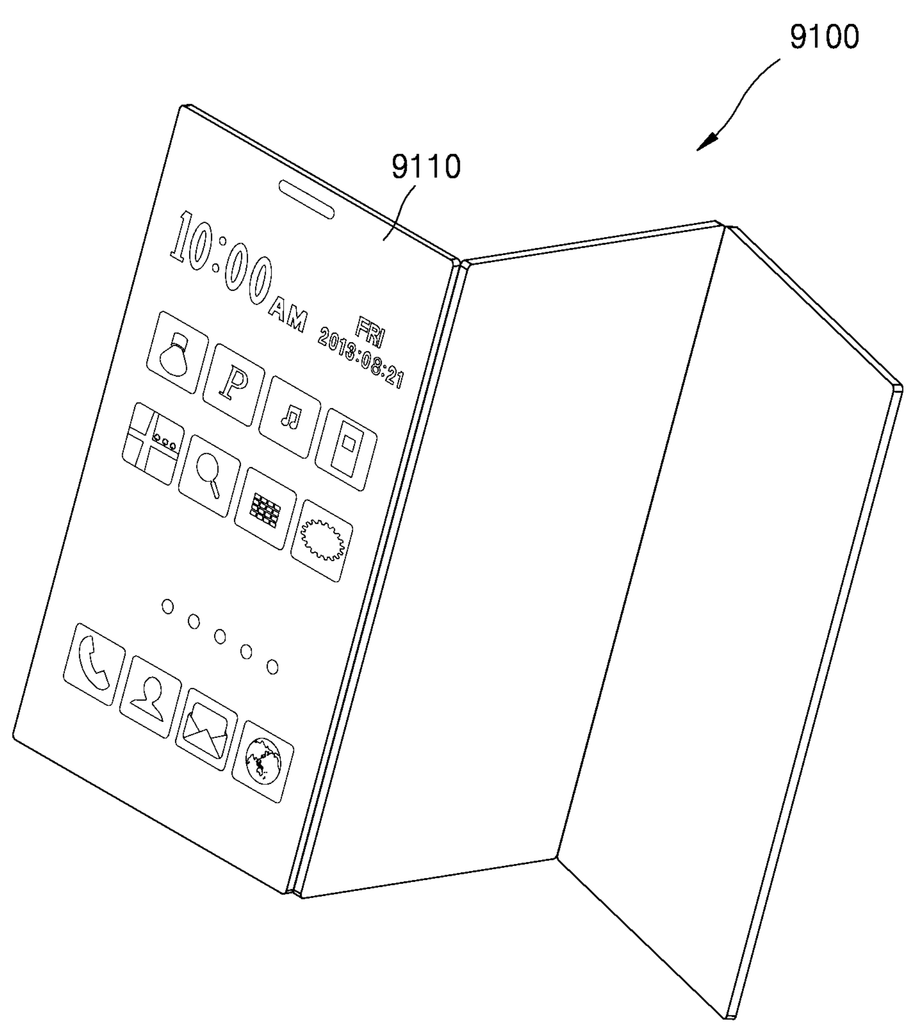
FIG. 10 illustrates an example of applying an electronic device according to an embodiment to a mobile device.

FIG. 10 illustrates an example of applying an electronic device according to an embodiment to a mobile device. The mobile device 9100 may include a display device 9110, and the display device 9110 may include a display transfer structure. The display device 9110 may have a foldable structure, for example, a multi-foldable structure.

Figure 11:
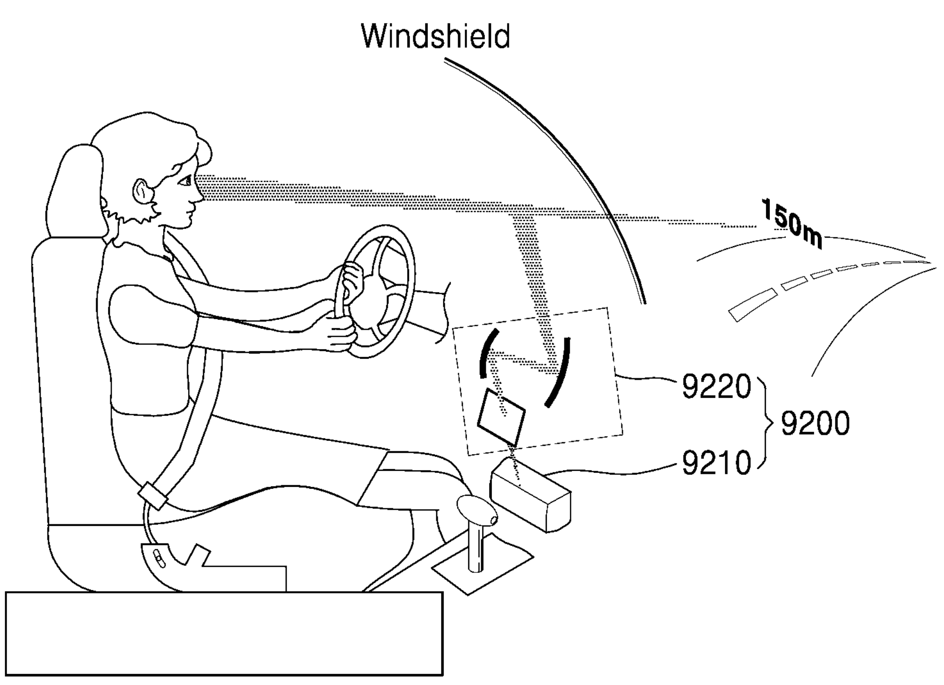
FIG. 11 illustrates an example of applying a display device according to an embodiment to a vehicle.

FIG. 11 illustrates an example of applying a display device according to an embodiment to a vehicle. The display device may be a head-up display device for a vehicle 9200, and may include a display 9210 in one area of the vehicle and an optical path change member 9220 that converts an optical path so that a driver may see an image generated on the display 9210.

Figure 12:
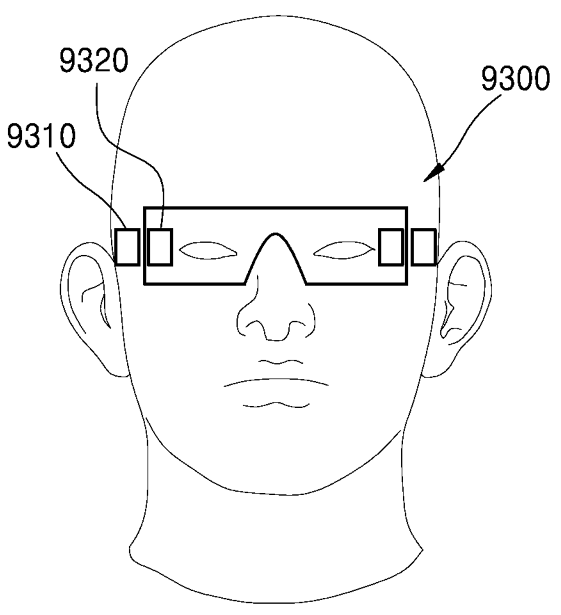
FIG. 12 illustrates an example of applying a display device according to an embodiment to augmented reality glasses or virtual reality glasses.

FIG. 12 illustrates an example of applying a display device according to an embodiment to augmented reality glasses or virtual reality glasses. The augmented reality glasses 9300 may include a projection system 9310 that forms an image and an element 9320 that guides the image from the projection system 9310 to enter a user's eyes. The projection system 9310 may include a display transfer structure.

Figure 13:
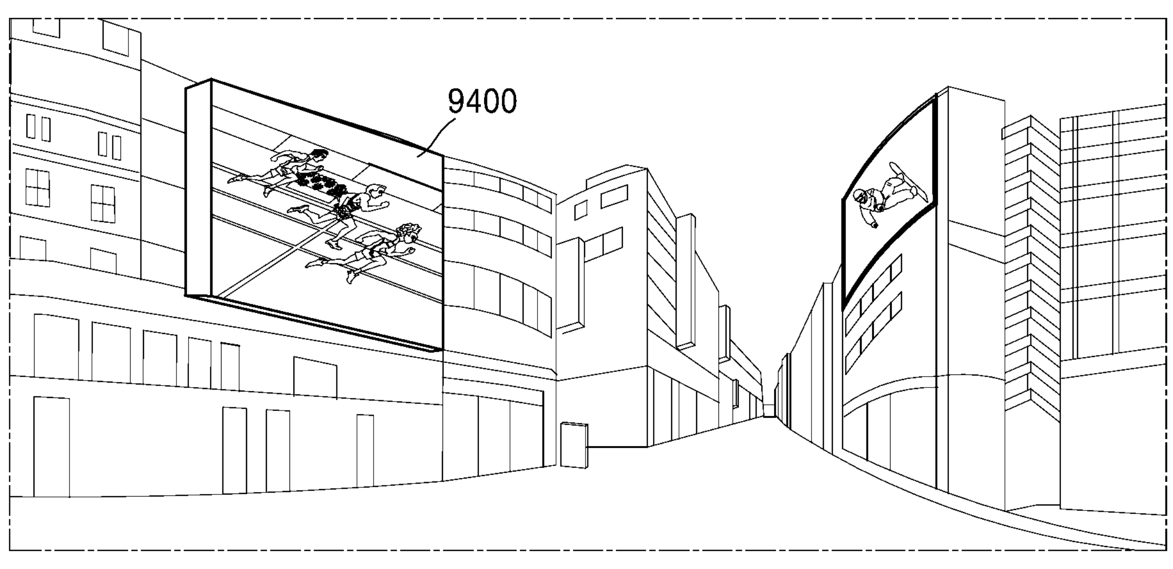
FIG. 13 illustrates an example of applying a display device according to an embodiment to a large signage.

FIG. 13 illustrates an example of applying a display device according to an embodiment to a large signage. The signage 9400 may be used for outdoor advertisements using a digital information display, and may control advertisement content, etc., through a communication network. The signage 9400 may be implemented, for example, through the electronic device described with reference to FIG. 9.

Figure 14:
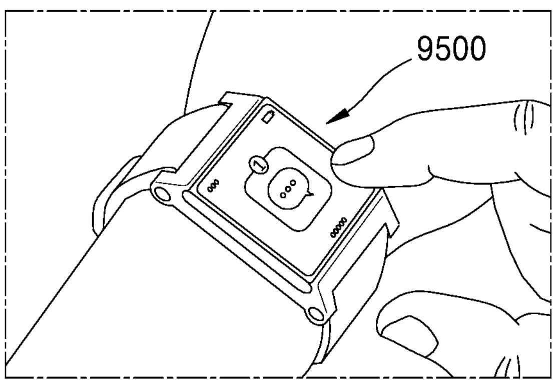
FIG. 14 illustrates an example of applying a display device according to an embodiment to a wearable display.

FIG. 14 illustrates an example of applying a display device according to an embodiment to a wearable display. The wearable display 9500 may include a display transfer structure and may be implemented through the electronic device described with reference to FIG. 9.

The micro semiconductor chip transfer method and micro semiconductor chip transfer device of embodiments of the present disclosure may increase the transfer yield by aligning micro semiconductor chips using hydrophobic wipers. According to the disclosed embodiment, the micro semiconductor chip transfer device and the micro semiconductor chip transfer device may separate a micro semiconductor chip transfer process from a micro semiconductor chip cleaning process using hydrophobic wipers for transfer.

According to the disclosed embodiment, the micro semiconductor chip transfer device and the micro semiconductor chip transfer device may use a hydrophobic wiper for transfer, thereby reducing friction between a micro semiconductor chip and a hydrophobic wiper, and increasing a transfer yield.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A micro semiconductor chip transfer method comprising:

preparing a transfer substrate comprising an upper portion having grooves formed therein;

supplying, to the upper portion of the transfer substrate, a suspension comprising micro semiconductor chips and a liquid; and aligning the micro semiconductor chips in the grooves by sweeping, with an alignment bar that comprises a hydrophobic wiper, an upper surface of the transfer substrate while the suspension is on the upper surface of the transfer substrate, wherein the aligning comprises moving, with the alignment bar, at least one of the micro semiconductor chips from the upper surface of the transfer substrate, outside of the grooves, into at least one of the grooves, and wherein the transfer substrate comprises a surface energy reduction pattern, and the surface energy reduction pattern comprises a plurality of convex patterns in an area between the grooves on the upper surface of the transfer substrate.

2. The micro semiconductor chip transfer method of claim 1, wherein the hydrophobic wiper comprises a material insoluble in a polar solvent.

3. The micro semiconductor chip transfer method of claim 1, wherein the hydrophobic wiper comprises polytetrafluoroethylene or nylon.

4. The micro semiconductor chip transfer method of claim 1, wherein the hydrophobic wiper comprises a filter, a mesh, a sheet, or a thin film.

5. The micro semiconductor chip transfer method of claim 1, wherein the liquid comprises at least one from among water, ethanol, alcohol, polyol, ketone, halocarbon, acetone, flux, and an organic solvent.

6. The micro semiconductor chip transfer method of claim 5, wherein the suspension further comprises a surfactant.

7. The micro semiconductor chip transfer method of claim 1, wherein the supplying the suspension comprises supplying the suspension using a spraying method, a dispensing method, an inkjet dot method, or a method of spilling the suspension onto the transfer substrate.

8. The micro semiconductor chip transfer method of claim 1, wherein the sweeping with the alignment bar of the upper surface of the transfer substrate comprises reciprocating, translating, rotating, rolling, rubbing, or spinning of the hydrophobic wiper.

9. The micro semiconductor chip transfer method of claim 1, wherein the sweeping with the alignment bar of the upper surface of the transfer substrate comprises performing a reciprocating motion, a rotational motion, a translational motion, a rolling motion, a rubbing, or a spinning of the transfer substrate.

10. The micro semiconductor chip transfer method of claim 1, wherein the aligning comprises aligning, by the sweeping, the micro semiconductor chips in a same direction in the grooves.

11. The micro semiconductor chip transfer method of claim 10, wherein each of the micro semiconductor chips comprises a first surface comprising an electrode and a second surface without any electrode, and wherein the aligning comprises aligning, by the sweeping, the micro semiconductor chips in the grooves such that the second surface of each of the micro semiconductor chips faces a bottom of one of the grooves.

12. The micro semiconductor chip transfer method of claim 1, further comprising cleaning the transfer substrate by removing, from the transfer substrate, the micro semiconductor chips that are not aligned inside the grooves and at least a portion of the liquid by sweeping the transfer substrate with an absorbent comprising a hydrophilic material.

13. The micro semiconductor chip transfer method of claim 12, wherein the cleaning the transfer substrate comprises moving the absorbent in a reciprocating motion, a translational motion, a rotational motion, a rolling motion, a rubbing motion, or a spinning motion.

14. A micro semiconductor chip transfer method comprising:

preparing a transfer substrate comprising an upper portion having grooves formed therein;

supplying, to the upper portion of the transfer substrate, a suspension comprising micro semiconductor chips and a liquid; and aligning the micro semiconductor chips in the grooves by sweeping, with an alignment bar that comprises a hydrophobic wiper, an upper surface of the transfer substrate while the suspension is on the upper surface of the transfer substrate, wherein the aligning comprises moving, with the alignment bar, at least one of the micro semiconductor chips from the upper surface of the transfer substrate, outside of the grooves, into at least one of the grooves, and wherein the hydrophobic wiper comprises an opening, and a size of the opening is 100 μm or less.

15. A micro semiconductor chip transfer device comprising:

a transfer substrate comprising an upper portion having grooves formed therein;

a transfer head on which the transfer substrate is seated;

a suspension supply module configured to supply a suspension to the upper portion of the transfer substrate on the transfer head, the suspension comprising at least one micro semiconductor chip and a liquid; and an align bar that comprises a hydrophobic wiper that is configured to sweep the transfer substrate, wherein the align bar is further configured to move, by sweeping the transfer substrate, the at least one micro semiconductor chip from an upper surface of the transfer substrate, outside of the grooves, into at least one of the grooves, and wherein the transfer substrate comprises a surface energy reduction pattern, and the surface energy reduction pattern comprises a plurality of convex patterns in an area between the grooves on the upper surface of the transfer substrate.

16. The micro semiconductor chip transfer device of claim 15, wherein the hydrophobic wiper comprises a material insoluble in a polar solvent.

17. The micro semiconductor chip transfer device of claim 15, wherein the hydrophobic wiper comprises polytetrafluoroethylene or nylon.

18. The micro semiconductor chip transfer device of claim 15, wherein the hydrophobic wiper comprises a filter, a mesh, a sheet, or a thin film.

19. The micro semiconductor chip transfer device of claim 15, wherein the suspension further comprises a surfactant.

20. The micro semiconductor chip transfer device of claim 15, further comprising a cleaning module comprising an absorbent comprising a hydrophilic material that is configured for cleaning the transfer substrate by removing, from the transfer substrate, at least a portion of the liquid and one or more of the at least one micro semiconductor chip that is not aligned inside the grooves.

* * * * *